(12) United States Patent
Komai

(10) Patent No.: US 8,854,895 B2
(45) Date of Patent: Oct. 7, 2014

(54) SEMICONDUCTOR MEMORY DEVICE

(71) Applicant: Kabushiki Kaisha Toshiba, Minato-ku (JP)

(72) Inventor: Hiromitsu Komai, Kamakura (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 13/946,384

(22) Filed: Jul. 19, 2013

(65) Prior Publication Data

US 2014/0241078 A1 Aug. 28, 2014

Related U.S. Application Data

(60) Provisional application No. 61/770,666, filed on Feb. 28, 2013.

(51) Int. Cl.
*G11C 16/06* (2006.01)
*G11C 7/08* (2006.01)

(52) U.S. Cl.
CPC ........................................ *G11C 7/08* (2013.01)
USPC ................... 365/185.22; 365/185.11; 365/239

(58) Field of Classification Search
CPC .......... G11C 16/08; G11C 16/28; G11C 8/04; G11C 16/06; G11C 7/22
USPC ............... 365/185.22, 185.21, 185.2, 185.09, 365/185.11, 185.12, 185.17, 230.03, 239
See application file for complete search history.

(56) References Cited

U.S. PATENT DOCUMENTS

| | | | |
|---|---|---|---|
| 6,922,364 B2 * | 7/2005 | Kojima | 365/185.33 |
| 7,110,294 B2 | 9/2006 | Kawai | |
| 7,277,325 B2 | 10/2007 | Fukuda et al. | |
| 7,286,416 B2 * | 10/2007 | Ooishi et al. | 365/189.05 |
| 7,324,389 B2 | 1/2008 | Cernea | |
| 2010/0302847 A1 | 12/2010 | Komai et al. | |
| 2012/0314504 A1 | 12/2012 | Komai | |
| 2013/0021852 A1 * | 1/2013 | Jeong | 365/189.05 |

FOREIGN PATENT DOCUMENTS

| | | |
|---|---|---|
| JP | 2006-331611 | 12/2006 |
| JP | 4102338 | 3/2008 |
| JP | 2009-531797 | 9/2009 |
| JP | 2010-277672 | 12/2010 |
| JP | 2012-256391 | 12/2012 |

* cited by examiner

*Primary Examiner* — Gene Auduong
(74) *Attorney, Agent, or Firm* — Oblon, Spivak, McClelland, Maier & Neustadt, L.L.P.

(57) ABSTRACT

A sense amplifier circuit is divided into a plurality of sense amplifier groups. The plurality of sense amplifier groups are each further divided into a plurality of sense units. A sense amplifier control circuit is configured to sequentially select the plurality of sense amplifier groups according to a physical address, and to sequentially select the plurality of sense units included in a selected sense amplifier group. The sense amplifier control circuit is configured to, when there is a defect related to a selected sense unit in a selected first sense amplifier group, select, in place of the first sense amplifier group, a sense unit included in a second sense amplifier group selected following after the first sense amplifier group. 139463

14 Claims, 15 Drawing Sheets

FIG. 6 a) Defective Column =0

| S/A Group4(0) | | | | S/A Group4(1) | | | | S/A Group4(2) | | | | S/A Group4(3) | | | |
|---|---|---|---|---|---|---|---|---|---|---|---|---|---|---|---|
| 0 | 4 | 8 | 12 | 16 | 20 | 24 | — | 1 | 5 | 9 | 13 | 17 | 21 | 25 | — | 2 | 6 | 10 | 14 | 18 | 22 | 26 | — | 3 | 7 | 11 | 15 | 19 | 23 | 27 | — |
| 0 | 4 | 8 | 12 | 16 | 20 | 24 | — | 1 | 5 | 9 | 13 | 17 | 21 | 25 | — | 2 | 6 | 10 | 14 | 18 | 22 | 26 | — | 3 | 7 | 11 | 15 | 19 | 23 | 27 | — |

Physical Address / Logical Address b) Defective Column =1

| S/A Group4(0) | | | | S/A Group4(1) | | | | S/A Group4(2) | | | | S/A Group4(3) | | | |
|---|---|---|---|---|---|---|---|---|---|---|---|---|---|---|---|
| 0 | 4 | 8 | 12 | 16 | 20 | 24 | — | 1 | 5 | 9 | 13 | 17 | 21 | 25 | — | 2 | 6 | 10 | 14 | 18 | 22 | 26 | — | 3 | 7 | 11 | 15 | 19 | 23 | 27 | — |
| 0 | 4 | ✗ | 12 | 16 | — | — | — | 1 | 5 | 8 | 12 | 16 | — | — | — | 2 | 6 | 10 | 14 | 18 | — | — | — | 3 | 7 | 11 | 15 | 19 | — | — | — | c) Defective Columns =2

| S/A Group4(0) | | | | S/A Group4(1) | | | | S/A Group4(2) | | | | S/A Group4(3) | | | |
|---|---|---|---|---|---|---|---|---|---|---|---|---|---|---|---|
| 0 | 4 | 8 | 12 | 16 | 20 | 24 | — | 1 | 5 | 9 | 13 | 17 | 21 | 25 | — | 2 | 6 | 10 | 14 | 18 | 22 | 26 | — | 3 | 7 | 11 | 15 | 19 | 23 | 27 | — |
| 0 | 4 | ✗ | 12 | 16 | 18 | — | — | 1 | 5 | 8 | 12 | 16 | 19 | — | — | 2 | 6 | 9 | 13 | ✗ | — | — | — | 3 | 7 | 10 | 14 | 17 | — | — | — | d) Defective Columns =3

| S/A Group4(0) | | | | S/A Group4(1) | | | | S/A Group4(2) | | | | S/A Group4(3) | | | |
|---|---|---|---|---|---|---|---|---|---|---|---|---|---|---|---|
| 0 | 4 | 8 | 12 | 16 | 20 | 24 | — | 1 | 5 | 9 | 13 | 17 | 21 | 25 | — | 2 | 6 | 10 | 14 | 18 | 22 | 26 | — | 3 | 7 | 11 | 15 | 19 | 23 | 27 | — |
| 0 | 4 | ✗ | 12 | 16 | 20 | — | — | 1 | 5 | 8 | 11 | 15 | 18 | — | — | 2 | 6 | 9 | 12 | ✗ | 19 | — | — | 3 | 7 | 10 | 13 | 16 | — | — | — | e) Defective Columns =4

| S/A Group4(0) | | | | S/A Group4(1) | | | | S/A Group4(2) | | | | S/A Group4(3) | | | |
|---|---|---|---|---|---|---|---|---|---|---|---|---|---|---|---|
| 0 | 4 | 8 | 12 | 16 | 20 | 24 | — | 1 | 5 | 9 | 13 | 17 | 21 | 25 | — | 2 | 6 | 10 | 14 | 18 | 22 | 26 | — | 3 | 7 | 11 | 15 | 19 | 23 | 27 | — |
| 0 | 4 | ✗ | 12 | ✗ | 20 | — | — | 1 | 5 | 8 | 11 | 14 | 17 | — | — | 2 | 6 | 9 | 12 | 15 | 18 | — | — | 3 | 7 | 10 | 13 | 16 | 19 | — | — |

✗ Defective Columns    — Redundancy Column

FIG. 13

SEMICONDUCTOR MEMORY DEVICE

CROSS REFERENCE TO RELATED APPLICATIONS

This application is based on and claims the benefit of priority from prior U.S. prior provisional Patent Application No. 61/770,666, filed on Feb. 28, 2013, the entire contents of which are incorporated herein by reference.

FIELD

Embodiments described in the present specification relate to a semiconductor memory device.

BACKGROUND

In recent years, a semiconductor memory device capable of a so-called interleaving operation has been proposed in order to speed up access to cache memory. An interleaving operation is an operation that divides a memory cell array into multiple areas, and provides a cache memory, a decoder, and so on to each of those multiple areas to enable parallel operation of the multiple areas, thereby allowing operation of the memory device to be speeded up.

However, there is a problem that in a semiconductor memory device adopting such an interleaving operation, rescue efficiency in a redundancy system deteriorates compared to when such an interleaving operation is not adopted.

BRIEF DESCRIPTION OF THE DRAWINGS

FIG. 6 explains an address control system and an operation of column redundancy in the semiconductor memory device of the first embodiment.

FIG. 13 explains an address control system and an operation of column redundancy in a semiconductor memory device of a comparative example adopting an interleaving system.

DETAILED DESCRIPTION

A semiconductor memory device in an embodiment described below comprises: a memory cell array configured having a plurality of bit lines and a plurality of memory cells arranged therein; a sense amplifier circuit operative to detect and amplify a signal read from the memory cell into the bit line; and a sense amplifier control circuit operative to control the sense amplifier circuit. The sense amplifier circuit is divided into a plurality of sense amplifier groups. The plurality of sense amplifier groups are each further divided into a plurality of sense units. The sense amplifier control circuit is configured to sequentially select the plurality of sense amplifier groups according to a physical address allocated to a column, and to sequentially select the plurality of sense units included in a selected sense amplifier group. The sense amplifier control circuit is configured to, when there is a defect related to a selected sense unit in a selected first sense amplifier group, select, in place of the first sense amplifier group, a sense unit included in a second sense amplifier group selected following after the first sense amplifier group.

Next, various kinds of embodiments are described in detail with reference to the drawings.

First Embodiment

Overall Configuration

Figure 1:
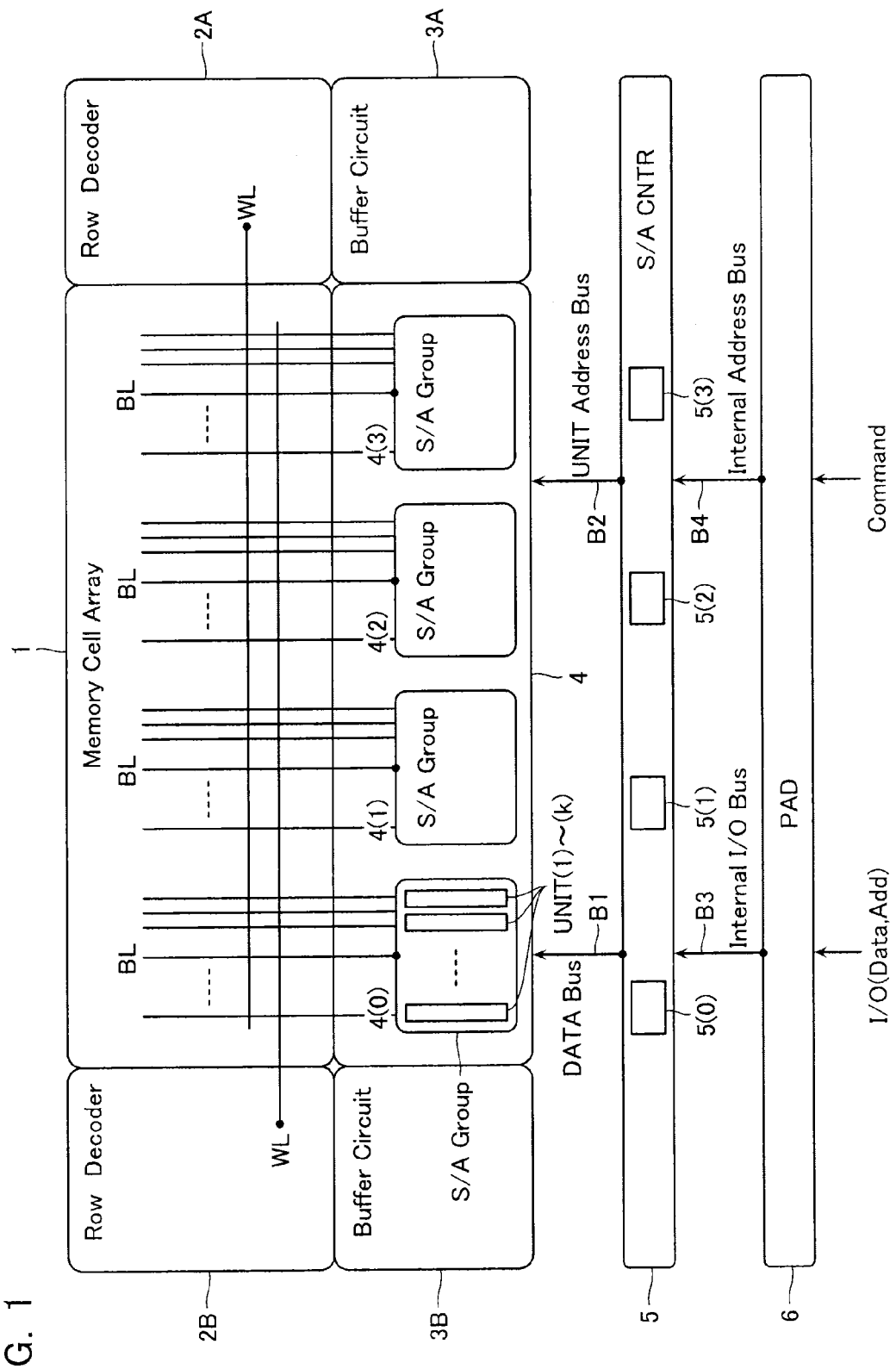
FIG. 1 is a block diagram showing an overall configuration of a semiconductor memory device in a first embodiment.

FIG. 1 is a block diagram showing an overall configuration of a semiconductor memory device in a first embodiment. This semiconductor memory device comprises a memory cell array 1, row decoders 2A and 2B, buffer circuits 3A and 3B, a sense amplifier circuit 4, a sense amplifier control circuit 5, and an input/output pad 6.

Figure 2:
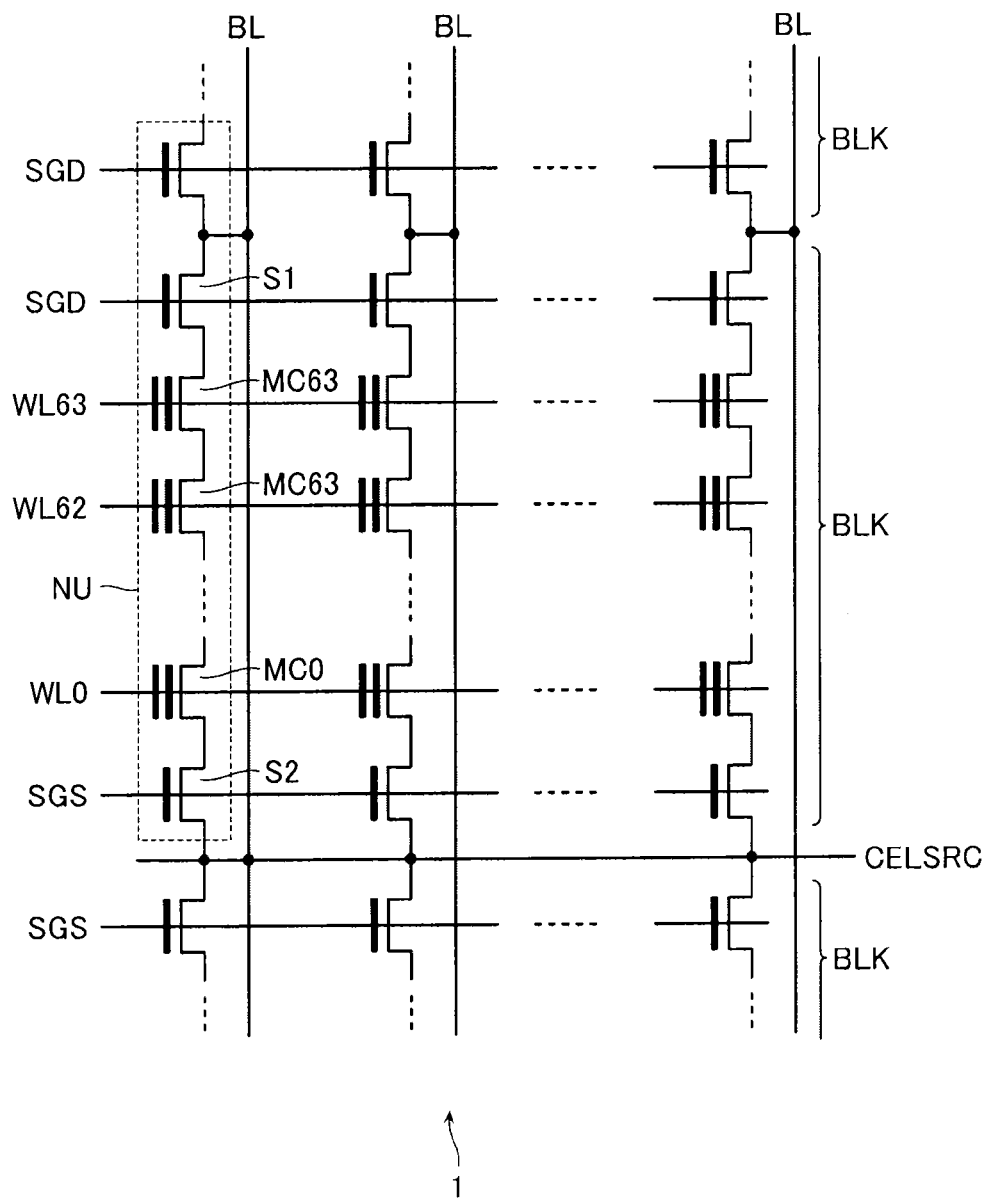
FIG. 2 shows a circuit configuration of a memory cell array 1 in FIG. 1.

As shown in FIG. 2, the memory cell array 1 is configured having NAND cell units NU arranged in a matrix therein. Moreover, the memory cell array 1 also has a plurality of bit lines BL and word lines WL arranged therein and connected to the NAND cell units. Each NAND cell unit NU includes: a memory string configured from a plurality of (in the example of FIG. 2, 64) electrically rewritable nonvolatile memory cells MC0~MC63 connected in series; and select gate transistors S1 and S2 connected to both ends of the memory string. One ends of the select gate transistors S1 and S2 are connected to the bit line BL and a common source line CELSRC, respectively. Now, each memory cell MC may be configured having a stacked gate structure in which a gate insulating film, a floating gate electrode (charge storage film), an inter-gate insulating film and a control gate electrode are stacked on a p type well formed on a semiconductor substrate.

Control gates of the memory cells MC0~MC63 in the NAND cell unit NU are connected to different word lines WL0~WL63, respectively. Gates of the select gate transistors S1 and S2 are connected to select gate lines SGD and SGS, respectively. A set of the NAND cell units NU sharing one word line WL configures a block BLK which is a unit of data erase. As shown in FIG. 2, a plurality of blocks BLK are disposed along a longitudinal direction of the bit line BL. Each bit line BL is connected to the sense amplifier circuit 4. A plurality of the memory cells MC commonly connected to one word line WL configures one page or a plurality of pages.

The row decoders 2A and 2B specify a row address according to an address (Add) supplied from the input/output buffer 6 via the buffer circuits 3A and 3B, and supply the word line WL with a voltage required in various kinds of operations, according to that row address.

The sense amplifier circuit 4 functions to detect and amplify a signal read from the bit line BL, and functions to temporarily hold data supplied from external in order to provide the bit line BL with a voltage corresponding to said data. The sense amplifier circuit 4 in this embodiment is divided into a plurality of (in this example, four) sense amplifier groups 4(0)~4(3) for execution of an interleaving operation. The number of sense amplifier groups 4 in one sense amplifier circuit 4 is not limited to four. There is no need for this number to be a power of two.

The sense amplifier groups 4(0)~4(3) are each further divided into a plurality of (for example, k) sense units UNIT(1)~UNIT(k). In this example, each sense unit UNIT is provided for one column and is connected to a plurality of the bit lines BL configuring one column. Note that it is also possible to adopt a configuration where one sense unit UNIT is provided for plurality of columns. As mentioned later, the sense units UNIT(1)~UNIT(k) are each able to perform a sense operation, a data hold operation, and an address decode operation in a stand-alone manner.

The sense amplifier control circuit 5 is a circuit functioning to control the sense amplifier circuit 4. The sense amplifier control circuit 5 is connected to the sense amplifier circuit 4 via a data bus B1 and a unit address bus B2. The data bus B1 is a data communication path for exchanging data to be written to the memory cell array 1 or data read from the memory cell array 1. Moreover, the unit address bus B2 is a data communication path for transmitting a unit address specifying an address of any of the previously mentioned sense units UNIT(1)~UNIT(k).

The sense amplifier control circuit 5 is configured to sequentially select the plurality of sense amplifier groups 4(0)~4(3) according to a physical address allocated to the column. Action of the sense amplifier control circuit 5 causes the k sense units UNIT included in a selected sense amplifier group 4(i) to be sequentially selected.

The sense amplifier control circuit 5 is further divided into a plurality of sense amplifier group control circuits 5(0)~5(3). The sense amplifier group control circuits 5(0)~5(3) each function to control any of the sense amplifier groups 4(0)~4(3). The sense amplifier control circuit 5 is connected to the input/output pad 6 via an internal I/O bus B3 and an internal address bus B4. Data and an address and a command inputted from the input/output pad 6 are transferred to the internal I/O bus B3 and the internal address bus B4.

(Sense Unit UNIT and Sense Amplifier Group Control Circuits 5(0)~5(3))

Next, a specific structure of the sense unit UNIT and the sense amplifier group control circuits 5(0)~5(3) will be described with reference to FIG. 3.

Figure 3:
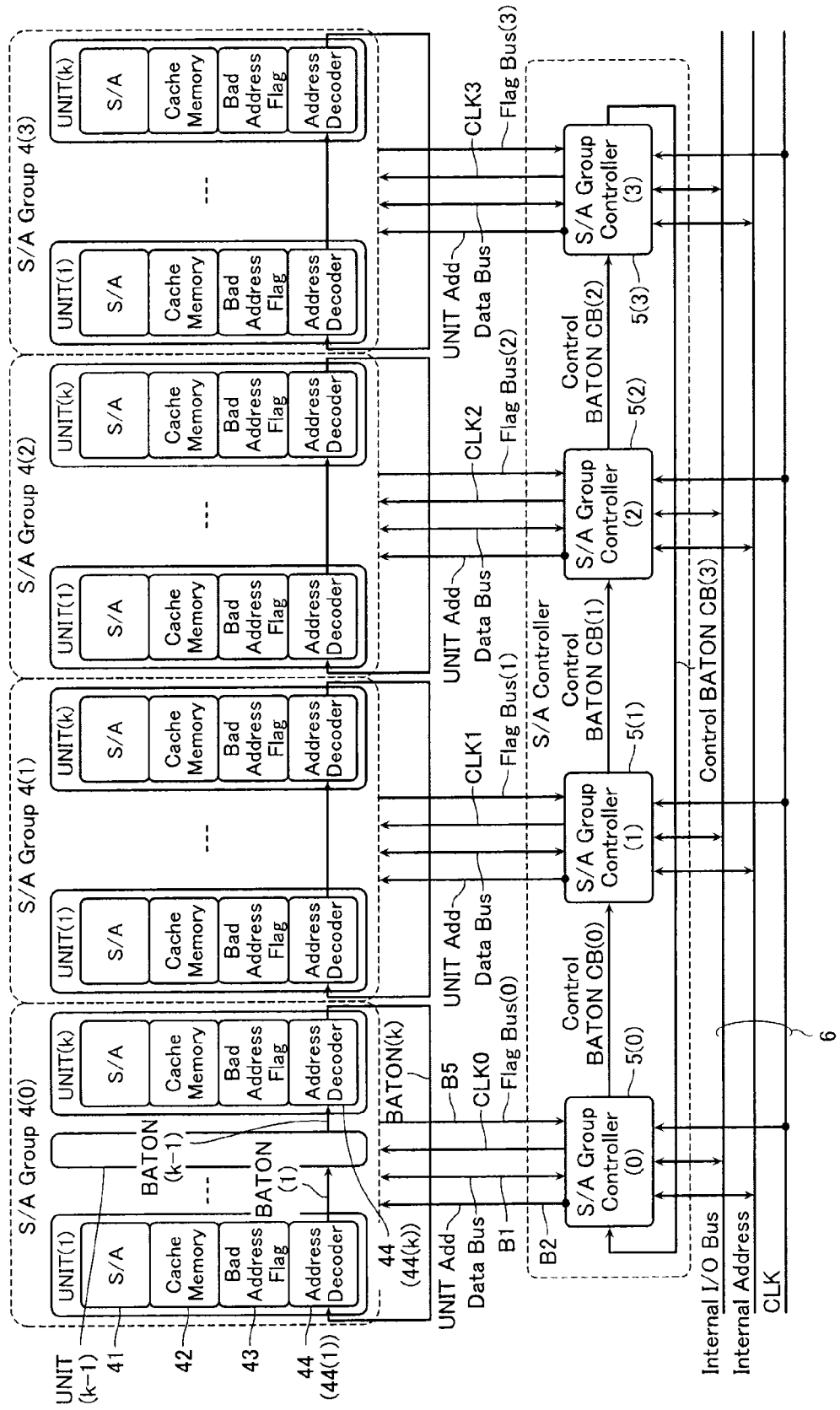
FIG. 3 is a block diagram showing a specific structure of a sense unit UNIT and sense amplifier group control circuits 5(0)~5(3).

As shown in FIG. 3, the sense units UNIT(1)~UNIT(k) each comprise a sense amplifier 41, a cache memory 42, a defect address flag holding circuit 43, and an address decoder 44.

The sense amplifier 41 is connected to the bit lines BL of one column, functions to detect and amplify a potential of these bit lines BL during data read, and functions to set the bit lines BL to a certain potential according to provided data during data write. The cache memory 42 is a memory device functioning to temporarily hold data read from the sense amplifier 41 or data to be provided to the sense amplifier 41.

The defect address flag holding circuit 43 functions to hold a defect address flag F indicating that a corresponding column is defective, and supply this defect address flag F to the sense amplifier group control circuit 5(i) (i=0~3) via a flag bus B5. The defect address flag F is stored in the defect address flag holding circuit 43 corresponding to the defective column, based on a result of a wafer-level pre-shipment inspection or a chip-by-chip post-shipment inspection.

The k address decoders 44(1)~44(k) in one sense amplifier group 4(i) are connected in the form of a loop circuit, and are configured to sequentially switch (transfer) baton signals BATON(1)~BATON(k) in that loop circuit. In other words, the baton signal BATON(j) outputted by a certain address decoder 44(j) (j=1~k) is supplied to an input terminal of the next-stage address decoder 44(j+1). However, the baton signal BATON(k) outputted by the last-in-line address decoder 44(k) is supplied to an input terminal of the first-stage address decoder 44(1).

Moreover, these address decoders 44(1)~44(k) are configured to be activated when they receive the unit address from the sense amplifier group control circuit 5(i) or when they receive the baton signal BATON="H". Furthermore, the address decoders 44(j) each function to shift to an inactivated state when their own operation has been completed and set the baton signal BATON(j) to "H" to activate the next-stage address decoder 44(j+1). As a result, only one of the sense units UNIT(1)~UNIT(k) in one sense amplifier group 4(i) is activated. Note that operation of the sense units UNIT(1)~UNIT(k) is controlled according to a clock signal CLKi supplied from the sense amplifier group control circuit 5(i).

In addition, as shown in FIG. 3, the sense amplifier group control circuits 5(0)~5(3) are connected in the form of a loop circuit, and are configured to sequentially switch control baton signals CB(0)~CB(3) transferred in that loop circuit. Moreover, these sense amplifier group control circuits 5(i) are configured to be activated when the control baton signal CB(i−1) received from the sense amplifier group control circuit 5(i−1) positioned on an upstream side of the sense amplifier group control circuit 5(i) has changed from "H" to "L", and to raise the control baton signal CB(i) outputted by the sense amplifier group control circuit 5(i) itself from "L" to "H" for a certain time period. When the control baton signal CB(i) rises, control of the sense amplifier group 4(i) is started. That is, this control baton signal CB functions as an enable signal for activating the sense amplifier group control circuits 5(0)~5(3).

Moreover, this control baton signal CB(i) rising to causes any one of the baton signals BATON(1)~BATON(k) in the corresponding sense amplifier group 4(i) to change its logic. In that sense, the control baton signal CB functions as an enable signal of the baton signal BATON. After any one of the sense amplifier group control circuits 5(0)~5(3) operates in an activated state for a certain time, it switches its control baton signal CB(0)~CB(3) to be outputted to "L" to activate the next-stage sense amplifier group control circuit. Note that timing of rise of this control baton signal CB is controlled by an externally supplied clock signal CLK.

A cycle of the clock signal CLK is shorter than that of the above-described clock signal CLKi. In this example of FIG. 3, the former is a quarter of the latter. The sense amplifier group control circuits 5(0)~5(3) generate clock signals CLK0~CLK3, respectively, based on the clock signal CLK. The clock signals CLK0~CLK3 have phases deviating from the clock signal CLK by a cycle at a time, respectively.

(Address Decoder 44)

Figure 4:
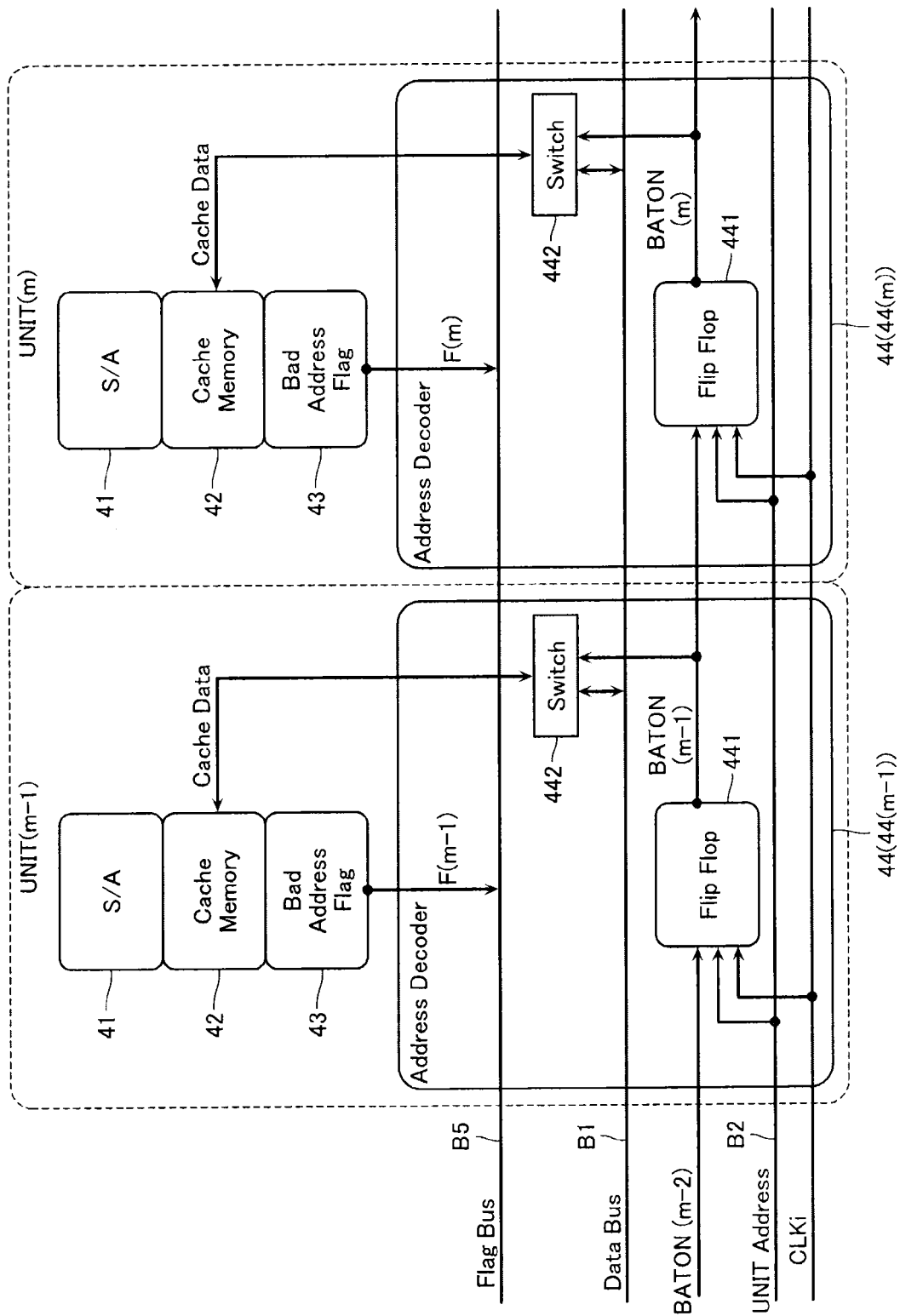
FIG. 4 is a block diagram explaining a configuration of an address decoder 44 in further detail.

Next, a configuration of the address decoder 44 will be described in further detail with reference to FIG. 4. The address decoders 44 each comprise a flip flop 441 and a switch 442. When the flip flop 441 has received the baton signal BATON="H" from the address decoder 44 in the sense unit UNIT positioned on an upstream side of the flip flop 441, the flip flop 441 is activated according to timing of the clock signal CLKi (i=0~3). Moreover, when the baton signal BATON(i−1) becomes "H", the switch 442 in the sense unit UNIT(i) is switched on, thereby connecting the data bus B1 and the cache memory 42.

Figure 5:
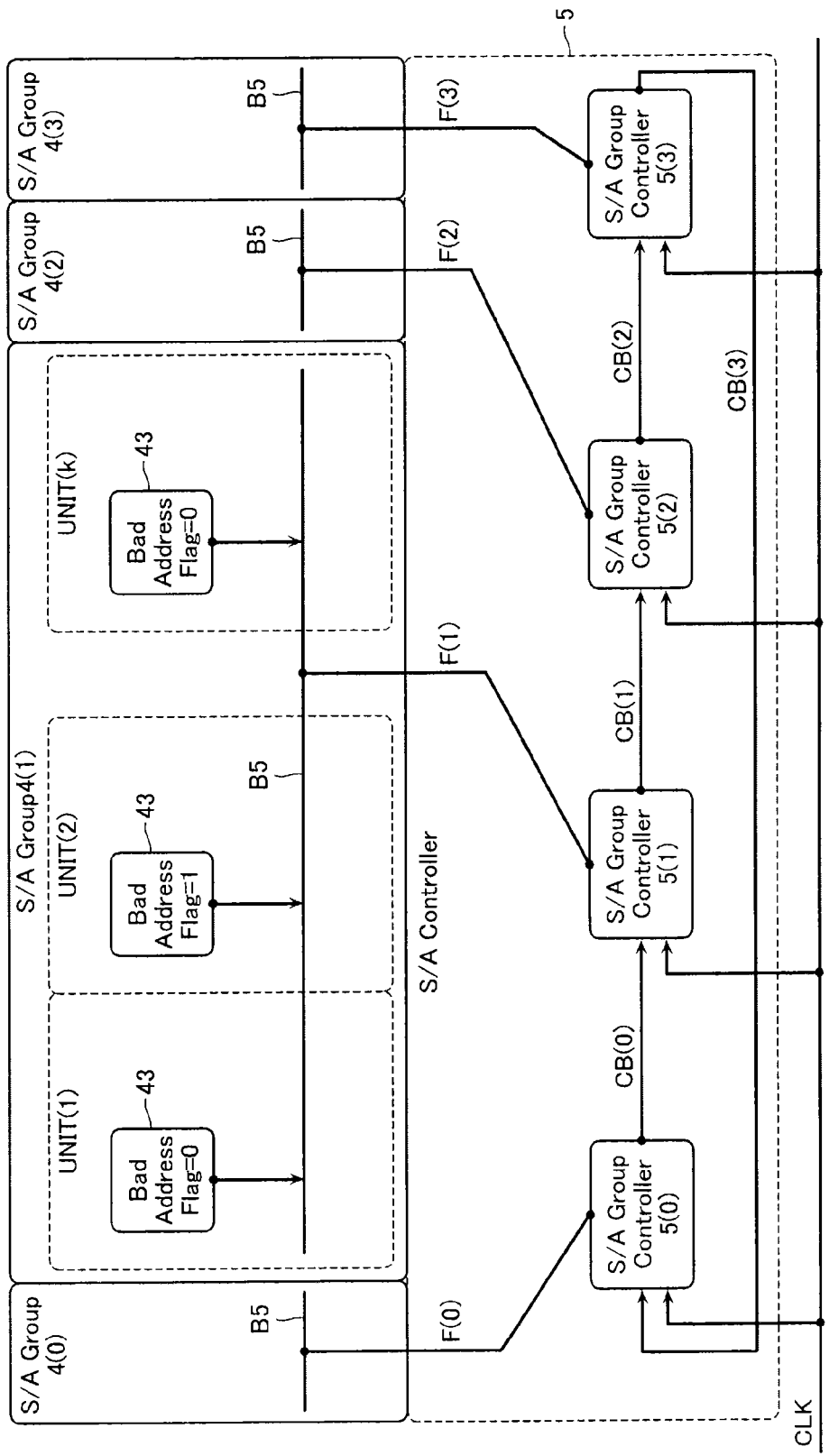
FIG. 5 is a block diagram explaining an operation between a defect address flag holding circuit 43 in each of the sense units UNIT and the sense amplifier group control circuit 5(i).

Furthermore, the flip flop 441 in the sense unit UNIT(j) (j=1, 2, . . . , m−2, m−1, m, . . . , k), after outputting the baton signal BATON(j)="H" to the flip flop 441 in the next sense unit UNIT(j+1) in synchronization with the clock signal CLKi, switches the baton signal BATON(j−1) inputted to itself to "L". As a result, the address decoder 44(j) in the sense unit UNIT(j) switches to an inactivated state and the switch 442 switches off. Note that, as shown in FIG. 5, the defect address flag holding circuit 43 in each sense unit UNIT transmits the held defect address flag F to the sense amplifier group control circuit 5(i) via the flag bus B5. The sense amplifier group control circuit 5(i) changes timing of a logic change of the control baton signal CB based on the defect address flag F.

(Address Control System and Column Redundancy)

Next, an address control system and an operation of column redundancy in the semiconductor memory device of this embodiment will be described with reference to FIG. 6. FIG. 6 illustrates schematically allocation of physical addresses to a plurality of columns under control of one sense amplifier group 4(i) and a method of column redundancy.

This FIG. 6 illustrates the case where the sense amplifier groups 4(0)~4(3) include 28 columns overall. Moreover, the 28 columns each have a physical address (0~27) allocated thereto. It is assumed here as an example that one sense amplifier group 4(i) includes seven columns. Moreover, each of the columns includes the previously mentioned sense unit UNIT.

However, of the 28 columns, 20 columns (0~19) are columns capable of being accessed by a user, and the remaining eight columns (20~27) are column redundancy-dedicated columns. That is, the column redundancy-dedicated columns having the physical addresses 20~27 are columns that are normally inaccessible by the user, but, when a column that is accessible by the user (0~19) is a defective column, undergo execution of column redundancy to become capable of being accessed. One sense amplifier group 4(i) is allocated with five user-accessible columns and two column redundancy-dedicated columns. The number of column redundancy-dedicated columns allocated to one sense amplifier group 4(i) is not limited to two, and need only be one or more.

In this embodiment, in order to execute an interleaving operation, consecutively numbered physical addresses are allocated sequentially (in loop form) to the adjacent sense amplifier groups 4(0)~4(3). In this example of FIG. 6, the lead physical address "0" is assigned to the sense amplifier group 4(0), but the next physical address "1" is assigned not to the sense amplifier group 4(0) but to the neighboring sense amplifier group 4(1). Similarly, the physical address "2" is assigned to the sense amplifier group 4(2), and, moreover, the next physical address "3" is assigned to the neighboring sense amplifier group 4(3). The next physical address "4" is assigned again to the sense amplifier group 4(0). Thereafter, in a similar manner, the consecutively numbered physical addresses are each assigned one at a time to the adjacent sense amplifier groups 4(i). As a result, the sense amplifier control circuit 5, when sequentially selecting consecutive logical addresses, can sequentially select the four sense amplifier groups 4(0)~4(3) to execute the interleaving operation. Note that the method of allocating addresses is not limited to that described above, and that various allocations are possible, as long as the interleaving operation is executed.

If attention is focused on one sense amplifier group 4(i), then, as shown in FIG. 6, the one sense amplifier group 4(i) is allocated with physical addresses that are four apart (in other words, the physical addresses in the one sense amplifier group 4(i) differ by four. For example, the sense amplifier group 4(0) is allocated with the physical addresses 0, 4, 8, 12, 16, 20, and 24). The reason for having physical addresses that differs by four is because the number of sense amplifier groups 4(i) is four. When the number of sense amplifier groups 4(i) is A, then physical addresses having reference numbers that differ by A at a time are allocated. Note that the five columns assigned with the physical addresses 0, 4, 8, 12, and 16 are user-accessible columns and the remaining two columns are column redundancy-dedicated columns.

A defective column sometimes occurs in some of the columns assigned with the physical addresses in this way. When the number of defective columns is zero, then the externally instructed logical addresses (unit addresses) and the physical addresses are in a one-to-one correspondence ("a" in FIG. 6).

On the other hand, when a defective column arises, there is a need to allocate the physical address of a normal column having an address number different from the externally instructed logical address. Such an operation for substituting a defective column with a normal column is a column redundancy operation.

FIG. 6 explains the column redundancy operation performed according to the number of defective columns.

First, the case where there is only one defective column in the entirety of sense amplifier groups 4(0)~4(3) will be described ("b" in FIG. 6). Specifically, the case where for example the column allocated with the physical address "8" in the sense amplifier group 4(0) is a defective column will be described.

In this case, when the logical address "8" is specified, this logical address "8" is transmitted to the sense unit UNIT in the sense amplifier group 4(0). The defect address flag holding circuit 43 in the sense unit UNIT assigned with the physical address "8" outputs the defect address flag F="H". The sense amplifier control circuit 5 treats the physical address "8" as "Don't care", based on this defect address flag F="H", and, instead, assigns the logical address "8" to the sense unit UNIT assigned with the physical address "9" (next consecutive address) in the sense amplifier group 4(1) neighboring the sense amplifier group 4(0) (the sense amplifier group 4(1) selected next after the sense amplifier group 4(0)). Hereafter, the sense unit UNIT corresponding to the physical address having an address number that is the assigned logical address with "1" added thereto is selected.

Next, the case where there are two defective columns in the entirety of sense amplifier groups 4(0)~4(3) will be described ("c" in FIG. 6). As an example, the case where the column allocated with the physical address "8" under control of the sense amplifier group 4(0) and the column allocated with the physical address "18" under control of the sense amplifier group 4(2) are defective columns will be described.

In such a case, when the logical address "8" is specified, the defect address flag holding circuit 43 in the sense unit UNIT assigned with the physical address "8" outputs the defect address flag F="H". The sense amplifier control circuit 5 treats the physical address "8" as "Don't care", based on this defect address flag F="H", and, instead, assigns the logical address "8" to the sense unit UNIT assigned with the physical address "9" (next consecutive address) in the neighboring sense amplifier group 4(1). Hereafter, the sense unit UNIT corresponding to the physical address having an address number that is the assigned logical address with "1" added thereto is selected.

Subsequently, when the logical address "17" is specified, the sense unit UNIT corresponding to the physical address "18" which is a defective column is selected, hence, in a similar manner, the physical address "19" is allocated instead of this. Thereafter, the sense unit UNIT corresponding to the physical address having an address number that is the assigned logical address with "2" added thereto is selected. Therefore, when the logical address "18" is specified, the sense unit UNIT corresponding to the physical address "20" is allocated.

Next, the case where there are three defective columns in the entirety of sense amplifier groups 4(0)~4(3) will be described (d in FIG. 6). As an example, the case where the columns allocated with the physical addresses "8" and "12" under control of the sense amplifier group 4(0) and the column allocated with the physical address "18" under control of the sense amplifier group 4(2) are defective columns will be described.

In such a case, when the logical address "8" is specified, the defect address flag holding circuit 43 in the sense unit UNIT assigned with the physical address "8" outputs the defect address flag F="H". The sense amplifier control circuit 5 treats the physical address "8" as "Don't care", based on this defect address flag F="H", and, instead, assigns the logical address "8" to the sense unit UNIT assigned with the physical address "9" (next consecutive address) in the neighboring sense amplifier group 4(1). Hereafter, the sense unit UNIT corresponding to the physical address having an address number that is the assigned logical address with "1" added thereto is selected.

Subsequently, when the logical address "11" is specified, the sense unit UNIT corresponding to the physical address "12" which is a defective column is selected, hence, in a similar manner, the physical address "13" is allocated instead of this. Thereafter, the sense unit UNIT corresponding to the physical address having an address number that is the assigned logical address with "2" added thereto is selected.

Subsequently, when the logical address "16" is specified, the sense unit UNIT corresponding to the physical address "18" which is a defective column is selected, hence, in a similar manner, the physical address "19" is allocated instead of this. Thereafter, the sense unit UNIT corresponding to the physical address having an address number that is the assigned logical address with "3" added thereto is selected.

Next, the case where there are four defective columns in the entirety of sense amplifier groups 4(0)~4(3) will be described (e in FIG. 6). As an example, the case where the columns allocated with the physical addresses "8", "12", "16", and "20" in the sense amplifier group 4(0) are defective columns will be described.

In such a case, when the logical address "8" is specified, the defect address flag holding circuit 43 in the sense unit UNIT assigned with the physical address "8" outputs the defect address flag F="H". The sense amplifier control circuit 5 treats the physical address "8" as "Don't care", based on this defect address flag F="H", and, instead, assigns the logical address "8" to the sense unit UNIT assigned with the physical address "9" (next consecutive address) in the neighboring sense amplifier group 4(1). Hereafter, the sense unit UNIT corresponding to the physical address having an address number that is the assigned logical address with "1" added thereto is selected.

Subsequently, when the logical address "11" is specified, the sense unit UNIT corresponding to the physical address "12" which is a defective column is selected, hence, in a similar manner, the physical address "13" is allocated instead of this. Thereafter, the sense unit UNIT corresponding to the physical address having an address number that is the assigned logical address with "2" added thereto is selected.

Subsequently, when the logical address "14" is specified, the sense unit UNIT corresponding to the physical address "16" which is a defective column is selected, hence, in a similar manner, the physical address "17" is allocated instead of this. Thereafter, the sense unit UNIT corresponding to the physical address having an address number that is the assigned logical address with "3" added thereto is selected.

Subsequently, when the logical address "17" is specified, the sense unit UNIT corresponding to the physical address "20" which is a defective column is selected, hence, in a similar manner, the physical address "21" is allocated instead of this. Thereafter, the sense unit UNIT corresponding to the physical address having an address number that is the assigned logical address with "4" added thereto is selected.

As described above, the present embodiment makes it possible to, when a defective column occurs in a certain sense amplifier group 4(i), allocate a column present in the adjacent sense amplifier group 4(i+1) (in other words, the sense amplifier group 4(i+1) to be selected next according to the interleaving operation).

Figure 13:
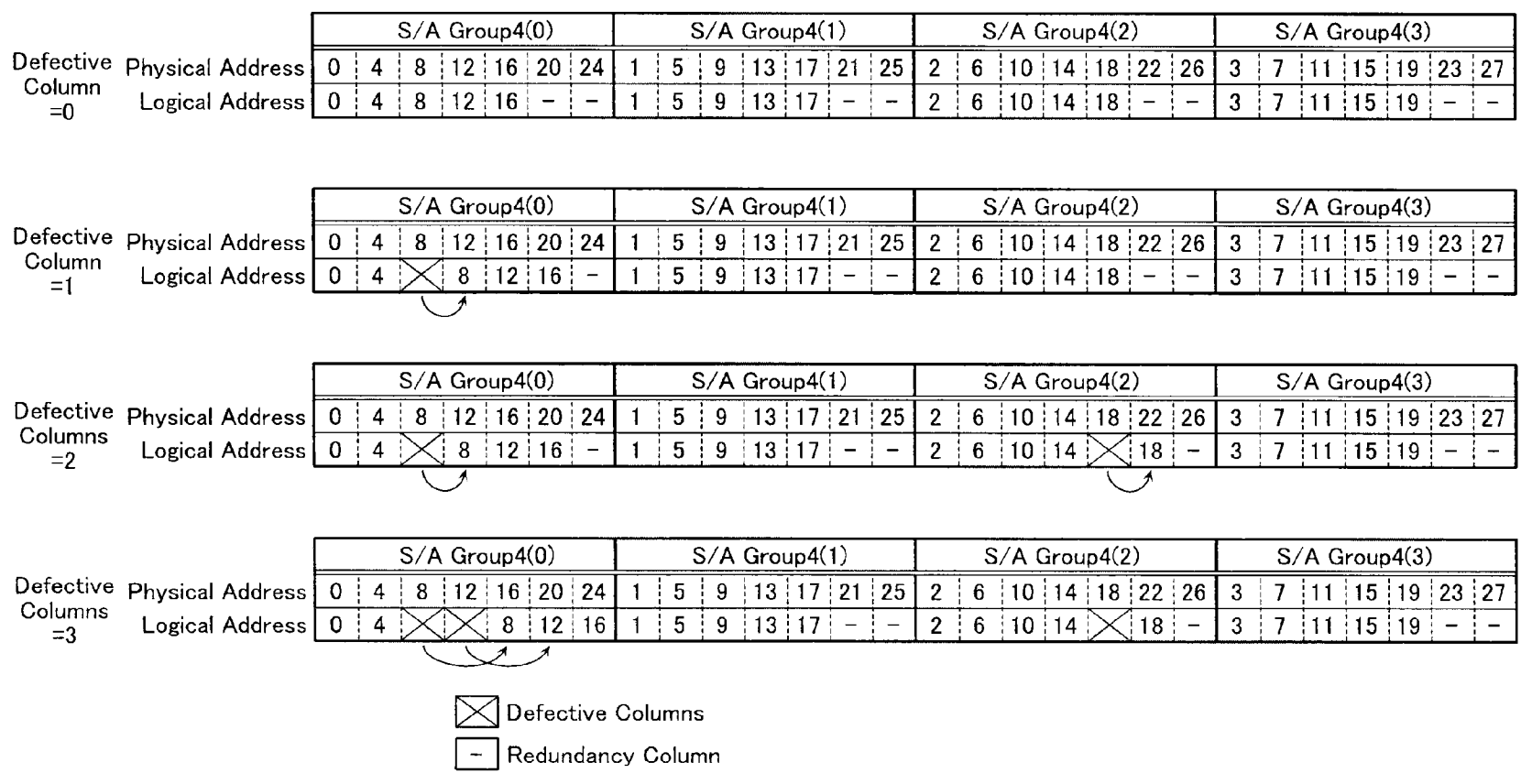

As shown in FIG. 13, in a semiconductor memory device of a comparative example adopting an interleaving system, when a defective column occurred in a certain sense amplifier group 4(i), it was only possible to replace with a column redundancy-dedicated column in the same sense amplifier group 4(i). Therefore, it was difficult to raise defect rescue efficiency of the column redundancy. The present embodiment, due to the above-described operation being performed, makes it possible to employ column redundancy-dedicated columns of other sense amplifier groups in defect rescue, thereby enabling defect rescue efficiency to be raised compared to the comparative example.

(Specific Example of Operation (1))

Figure 7A:
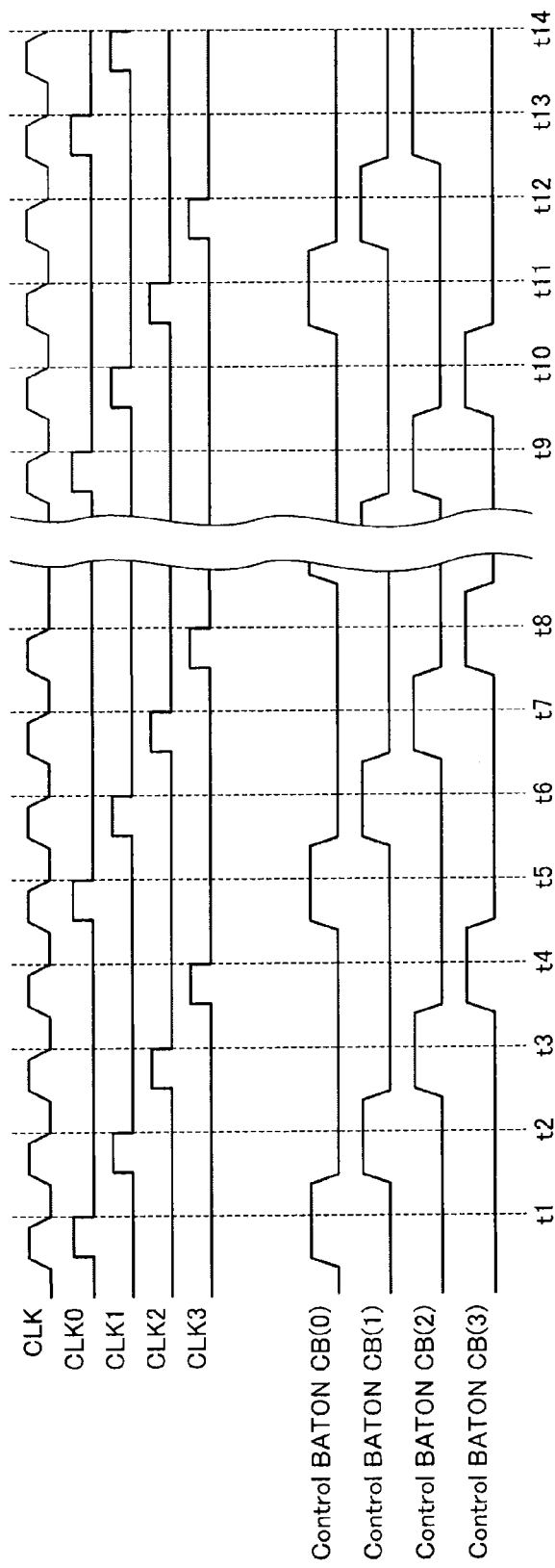
FIGS. 7A and 7B are timing charts explaining a specific example of operation of the semiconductor memory device in the first embodiment.
Figure 7B:
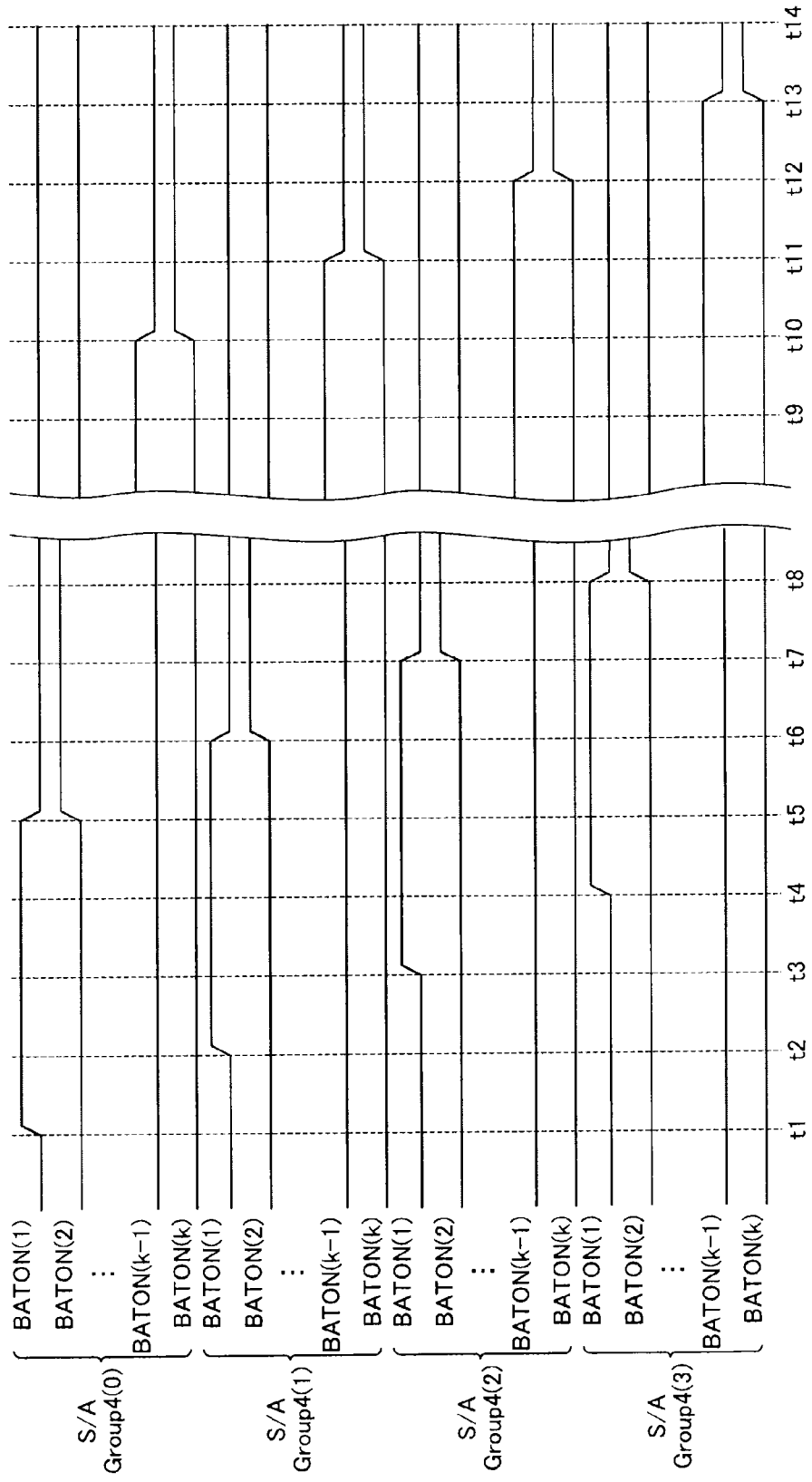
Figure 8:
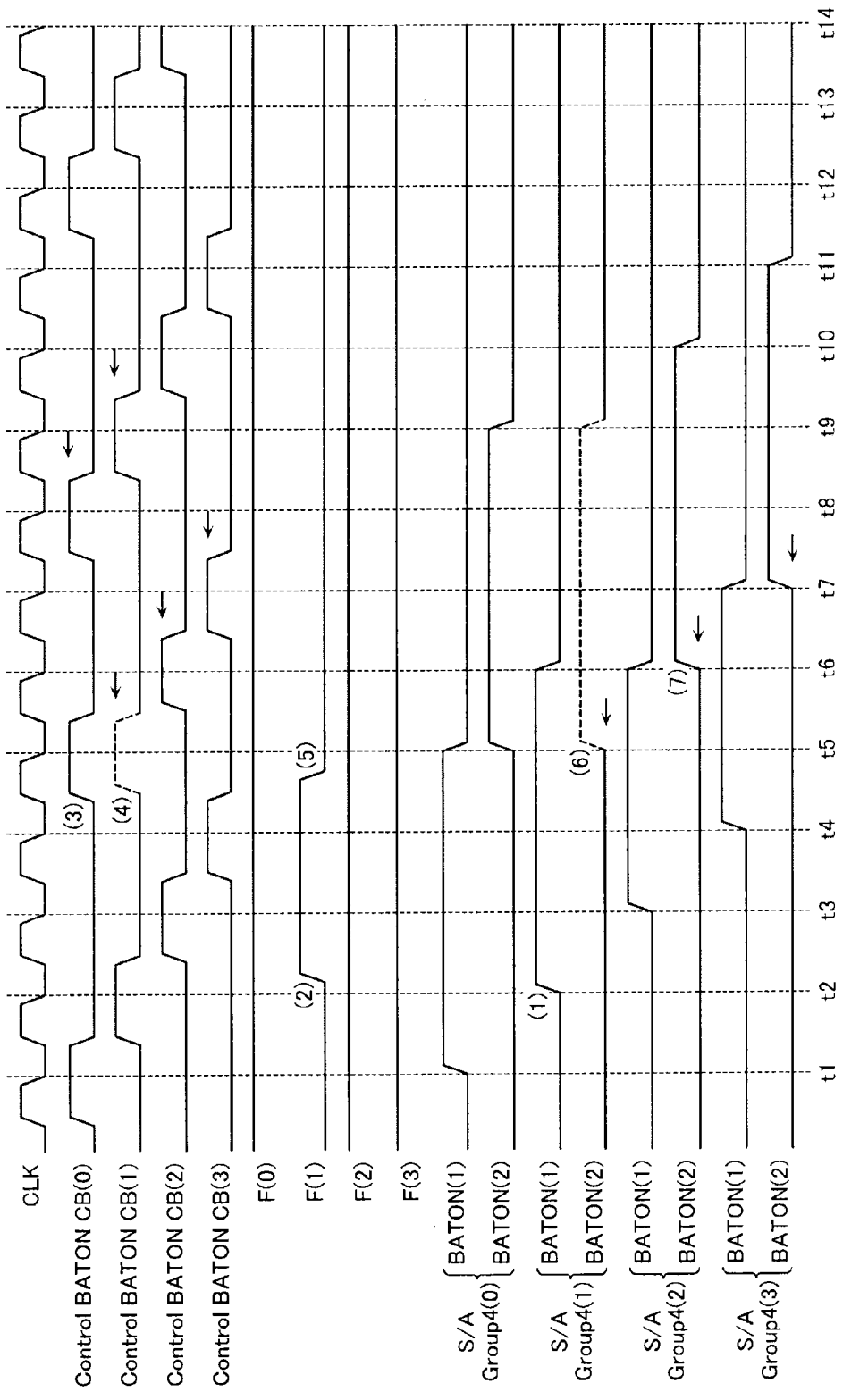
FIG. 8 is a timing chart explaining a specific example of operation of the semiconductor memory device in the first embodiment.
Figure 9:
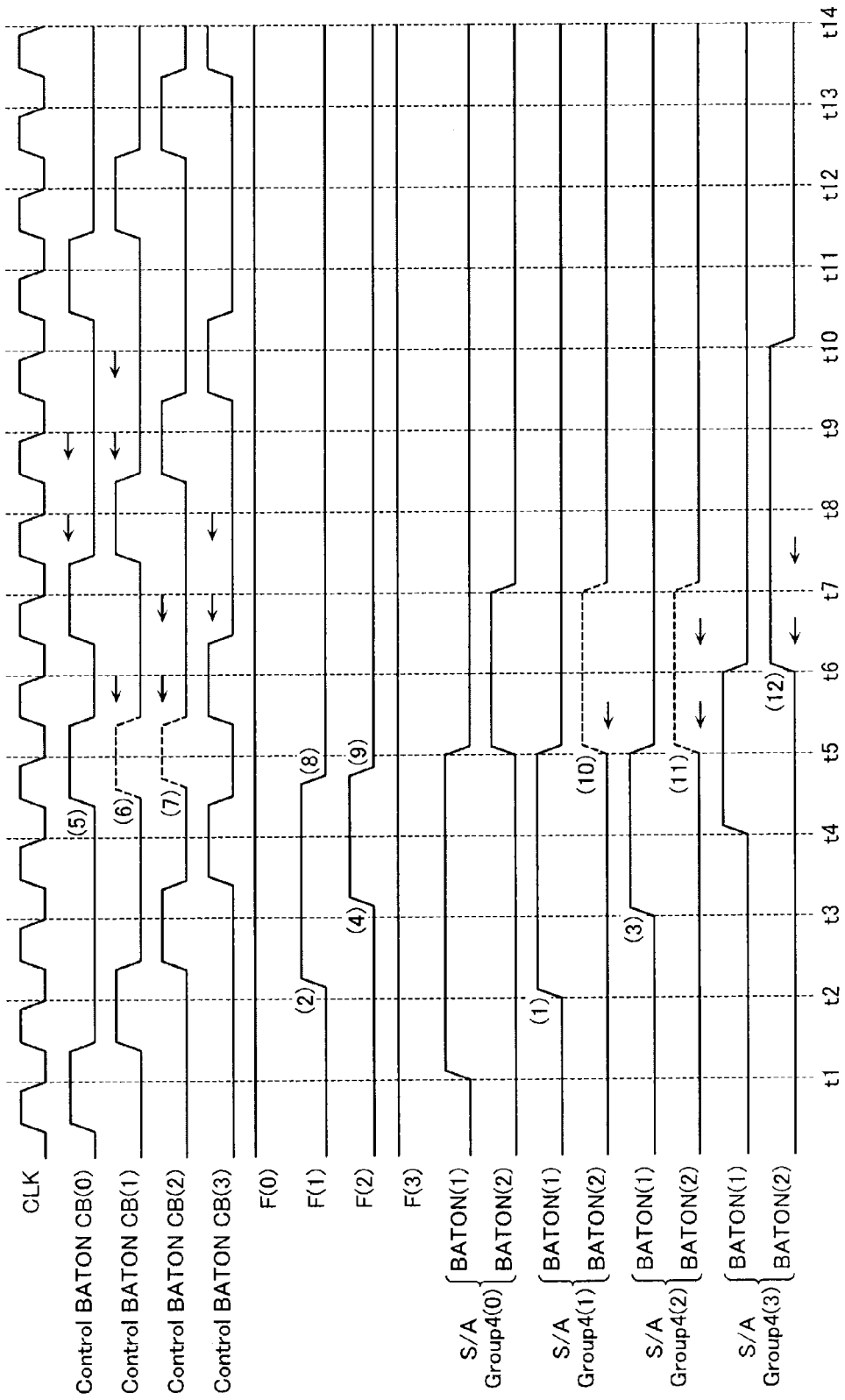
FIG. 9 is a timing chart explaining a specific example of operation of the semiconductor memory device in the first embodiment.

Next, a specific example of operation of the semiconductor memory device in this first embodiment will be described with reference to FIGS. 7A through 9. FIGS. 7A and 7B are timing charts showing changes in signals when the number of defective columns is zero. In addition, FIGS. 8 and 9 are timing charts showing changes in signals when a defective column has occurred.

When operation of the semiconductor memory device is started, first, in the sense amplifier group control circuits 5(0)~5(3), the control baton signals CB(0)~CB(3) rise to "H", sequentially. The control baton signals CB(0)~CB(3) each have a cycle 4T which is four times a cycle T of the clock signal CLK, and have phases which differ from each other by an amount of the cycle T. In addition, while any single one of the control baton signals CB(0)~CB(3) is at "H", the other three are all "L". As a result, the sense amplifier groups 4(0)~4(3) switch an operation state with timings that differ by an amount of the cycle T of the clock signal CLK, respectively.

Note that in the above-described example, the reason the control baton signals CB(0)~CB(3) each have a cycle 4T is due to there being four sense amplifier groups 4(i). If the number of sense amplifier groups 4(i) is A, the cycle becomes that number A multiplied by T (A×T).

When the clock signal CLKi becomes "H", any one of the k sense units UNIT(1)~UNIT(k) in the sense amplifier group 4(i) is alternatively selected to operate. Similarly to the control baton signals CB(0)~CB(3), the clock signals CLKi each have a cycle 4T which is four times the cycle T of the clock signal CLK, and have phases which differ from each other by an amount of the cycle T. The one sense unit UNIT first selected from the k sense units UNIT(1)~UNIT(k) is determined by the unit address, and after that, adjacent sense units UNIT are sequentially selected according to the baton signals BATON(1)~BATON(k). As a result, when the cycle of the clock signal CLK is set to T, any one of the k sense units UNIT in one sense amplifier group 4(i) is selected with a cycle of 4×T.

The sense amplifier groups 4(0)~4(3) operate as described above, whereby an interleaving operation is performed. When the number of defective columns is zero, the sense amplifier groups 4(0)~4(3) operate as shown in FIGS. 7A and 7B.

Next, operation when a defective column has occurred will be described with reference to FIG. 8. Described here as an example is the case where one column of the sense unit UNIT(2) in the sense amplifier group 4(1) is a defective column.

In this case, the defect address flag F(1)="H" is held in the defect address flag holding circuit 43 of the sense unit UNIT (2) in the sense amplifier group 4(1). When the baton signal BATON(1) outputted by the sense unit UNIT(1) which is upstream of this sense unit UNIT(2) in the loop circuit becomes "H" ((1) in FIG. 8), the sense unit UNIT(2) outputs the defect address flag F(1)="H" toward the sense amplifier group control circuit 5(1) via the flag bus B5((2) in FIG. 8). As a result, timing of logic change of the control baton signals CB in the sense amplifier group control circuits 5(0)~5(3) changes. That is, when the control baton signal CB(0) becomes "H" ((3) in FIG. 8), the control baton signal CB(1) correspondingly becomes "H", non-synchronously with the clock signal CLK ((4) in FIG. 8). That is, the control baton signal CB(0) and the control baton signal CB(1) become "H" substantially simultaneously. As a result, the baton signal BATON(2) in the sense amplifier group 4(1) rises to "H" earlier by an amount of the cycle T compared to when assumed there was no defective column ((6) in FIG. 8) (Note that the defect address flag F(1) returns to "L" after the control baton signal CB(1) has become "H".

However, since the sense amplifier group control circuit 5(1) has received that the defect address flag F(1)="H", the sense amplifier group control circuit 5(1) does not perform a write operation on the sense unit UNIT(2) in the sense amplifier group 4(1). Then, the baton signal BATON(2) in the sense amplifier group 4(2) rises to "H" delayed by an amount of the cycle T ((7) in FIG. 8). As a result, data which originally ought to have been written to the sense unit UNIT(2) in the sense amplifier group 4(1) is written to the sense unit UNIT(2) in the sense amplifier group 4(2). That is, a defective column in a certain sense amplifier group is replaced by a normal column in the adjacent sense amplifier group, whereby the operation shown in FIG. 6 is achieved. Note that the defect address flag F(1) has returned to "L", hence in operation thereafter, any one of the control baton signals CB is switched to "H" for a certain time period, without a plurality of the control baton signals CB ever simultaneously becoming "H". That is, an operation for performing write to a column having a physical address which is the specified logical address with "1" added thereto is repeated.

(Specific Example of Operation (2))

Next, a separate example of operation will be described with reference to FIG. 9. Described here as an example is the case where one column of the sense unit UNIT(2) in the sense amplifier group 4(1) and one column of the sense unit UNIT (2) in the sense amplifier group 4(2) are defective columns. In this case, the defect address flags F(1)=F(2)="H" are held in the defect address flag holding circuit 43 of the sense unit UNIT(2) in the sense amplifier group 4(1) and the defect address flag holding circuit 43 of the sense unit UNIT(2) in the sense amplifier group 4(2), respectively.

The sense unit UNIT(2) of the sense amplifier group 4(1) outputs, when the baton signal BATON(1) outputted by the sense unit UNIT (1) which is upstream of the sense unit UNIT(2) in the loop circuit becomes "H" ((1) in FIG. 9), the defect address flag F(1)="H" toward the sense amplifier group control circuit 5(1) via the flag bus B5((2) in FIG. 9). Meanwhile, the sense unit UNIT(2) of the sense amplifier group 4(2) outputs, when the baton signal BATON(1) outputted by the sense unit UNIT(1) which is upstream of the sense unit UNIT(2) in the loop circuit becomes "H" ((3) in FIG. 9), the defect address flag F(2)="H" toward the sense amplifier group control circuit 5(2) via the flag bus B5((4) in FIG. 9).

When the defect address flags F(1) and F(2)="H" are transmitted to the sense amplifier group control circuits 5(1) and 5(2) in this way, timing of logic change of the control baton signals CB in the sense amplifier group control circuits 5(0) ~5(3) changes. That is, after the control baton signal CB(0) has risen to "H", the control baton signals CB(1) and CB(2) also rise to "H", non-synchronously with the clock signal CLK ((6) and (7) in FIG. 9). That is, the control baton signals CB(0)~CB(2) rise to "H" simultaneously. Note that when the control baton signal CB(1) becomes "H", the defect address flag F(1) becomes "L" ((8) in FIG. 9), and when the control baton signal CB(2) becomes "H", the defect address flag F(2) also becomes "L" ((9) in FIG. 9).

As a result, the baton signal BATON(2) in the sense amplifier group 4(1) rises to "H" with a timing which is earlier than normal by an amount of the cycle T ((10) in FIG. 9). Moreover, the baton signal BATON(2) in the sense amplifier group 4(2) also rises to "H" with a timing which is earlier than normal by an amount of a cycle of 2×T ((11) in FIG. 9). Therefore, write is not performed on the one column of the sense unit UNIT(2) in the sense amplifier group 4(1) and the one column of the sense unit UNIT(2) in the sense amplifier group 4(2). Instead, the control baton signal CB(3) becomes "H" with a timing which is later than the above-described (5)~(7) by an amount of the cycle T, whereby the baton signal BATON(2) in the sense amplifier group 4(3) rises and write is executed on the corresponding sense unit UNIT(2). Operation thereafter is similar to that in FIG. 8.

Advantages of First Embodiment

As described above, the semiconductor memory device in the first embodiment enables a defective column occurring in a certain sense amplifier group to be replaced with a column under control of a separate adjacent sense amplifier group, while also enabling operation to be speeded up by executing an interleaving operation. Therefore, defect rescue efficiency can be improved compared to the semiconductor memory device of the comparative example adopting the interleaving operation.

Second Embodiment

Next, a semiconductor memory device in a second embodiment will be described with reference to FIG. 10. An overall configuration of the second embodiment is substantially identical to that of the first embodiment, excluding portions explained in FIG. 10, hence duplicated description of the overall configuration is omitted.

Figure 10:
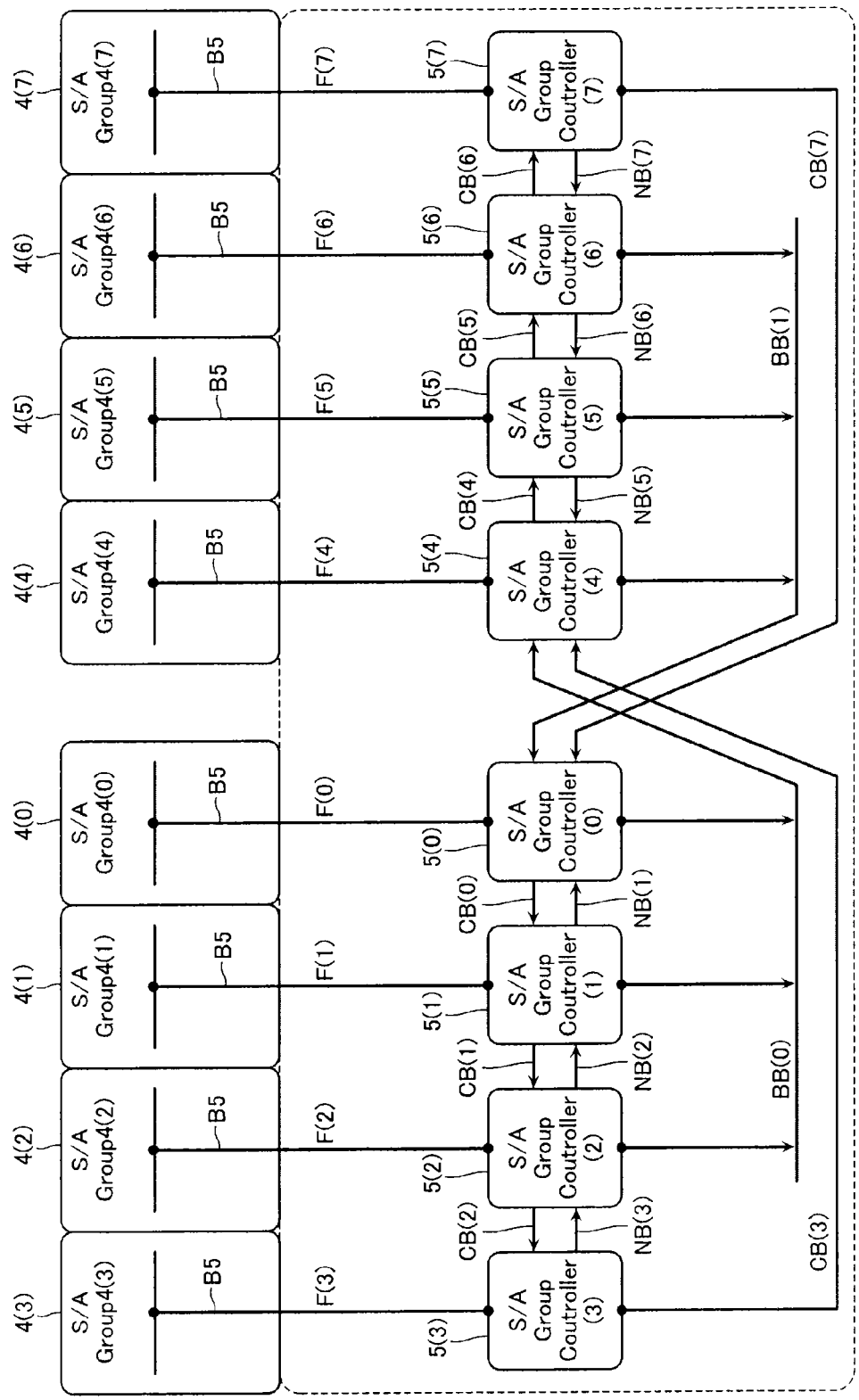
FIG. 10 is a block diagram showing a configuration of a semiconductor memory device in a second embodiment.

FIG. 10 is a circuit diagram showing a configuration of the sense amplifier group control circuits in the semiconductor memory device of the second embodiment. As shown in FIG. 10, the sense amplifier circuit 4 in the semiconductor memory device of this second embodiment is divided into eight sense amplifier groups 4(0)~4(7). In addition, the sense amplifier control circuit 5 comprises eight sense amplifier group control circuits 5(0)~5(7) corresponding to these eight sense amplifier groups 4(0)~4(7).

When the number of sense amplifier group control circuits 5(i) increases as in this second embodiment, propagation delay of the control baton signals CB increases. In the case where frequency of the clock signal is high, when propagation delay increases, it becomes difficult to handle defect column addresses occurring consecutively, with the result that defect rescue efficiency in column redundancy decreases. Accordingly, the sense amplifier group control circuits 5 in this second embodiment are configured as follows.

First, regarding the sense amplifier group control circuits 5(0)~5(3), the leading sense amplifier group control circuit 5(0) is disposed slightly to a left side of center of a circuit region of the sense amplifier control circuit 5, and the following sense amplifier group control circuits 5(1)~5(3) are arranged aligned in ascending order toward an outer side of the circuit region. Similarly, regarding the sense amplifier group control circuits 5(4)~5(7), the leading sense amplifier group control circuit 5(4) is disposed slightly to a right side of center of the circuit region, and the following sense amplifier group control circuits 5(5)~5(7) are arranged aligned in ascending order toward the outer side of the circuit region.

Moreover, the sense amplifier group control circuits 5(0)~5(7) disposed in this way are connected in numerical order and transfer the control baton signals CB(0)~CB(7) in ascending order of reference number. In other words, the sense amplifier group control circuits 5(0)~5(7) are connected in a so-called figure-of-eight shape, and the control baton signals CB(0)~CB(7) are propagated along a closed circuit of that figure-of-eight shape. This is different from the sense amplifier group control circuits 5(0)~5(3) in the first embodiment being connected in a simple loop shape.

In addition, in the sense amplifier group control circuits 5(0)~5(7) disposed in this way, next baton signals NB(0)~NB(7) are transferred in ascending order of reference number. That is, these next baton signals NB(0)~NB(7) have a direction of flow which is the reverse of that of the control baton signals CB(0)~CB(7). The next baton signal NB(i) is a signal for indicating there is a defect in the sense amplifier group on a downstream side and becomes "H" when the next baton signal NB(i+1) and the defect address flag F(i) are both "H". However, the sense amplifier group control circuits 5(3) and 5(7) most to the outer side switch to "H" merely by the defect address flags F(3) and F(7), respectively, becoming "H".

Furthermore, the sense amplifier group control circuits 5(0)~5(2) in this second embodiment output a bypass baton signal BB(0) and input this bypass baton signal BB(0) to the sense amplifier group control circuit 5(4). Moreover, the sense amplifier group control circuits 5(4)~5(6) output a bypass baton signal BB(1) and input this bypass baton signal BB(1) to the sense amplifier group control circuit 5(0). These bypass baton signals BB(0) and BB(1) are both signals for reducing propagation delay of the control baton signals CB.

That is, when the columns intended to be made write operation targets by the sense amplifier group control circuits 5(x) (x=1~3) that are more to the outer side than the sense amplifier group control circuits 5(0)~5(2) are judged to be all defective, the sense amplifier group control circuits 5(0)~5(2) switch this bypass baton signal BB(0) to "H". Similarly, when the columns intended to be made write operation targets by the sense amplifier group control circuits 5(x) (x=5~7) that are more to the outer side than the sense amplifier group control circuits 5(4)~5(6) are judged to be all defective, the sense amplifier group control circuits 5(4)~5(7) switch the bypass baton signal BB(1) to "H". This makes it possible to suppress needless receiving of propagation delay by the control baton signals CB and to handle even cases where defective columns occur consecutively.

Figure 11:
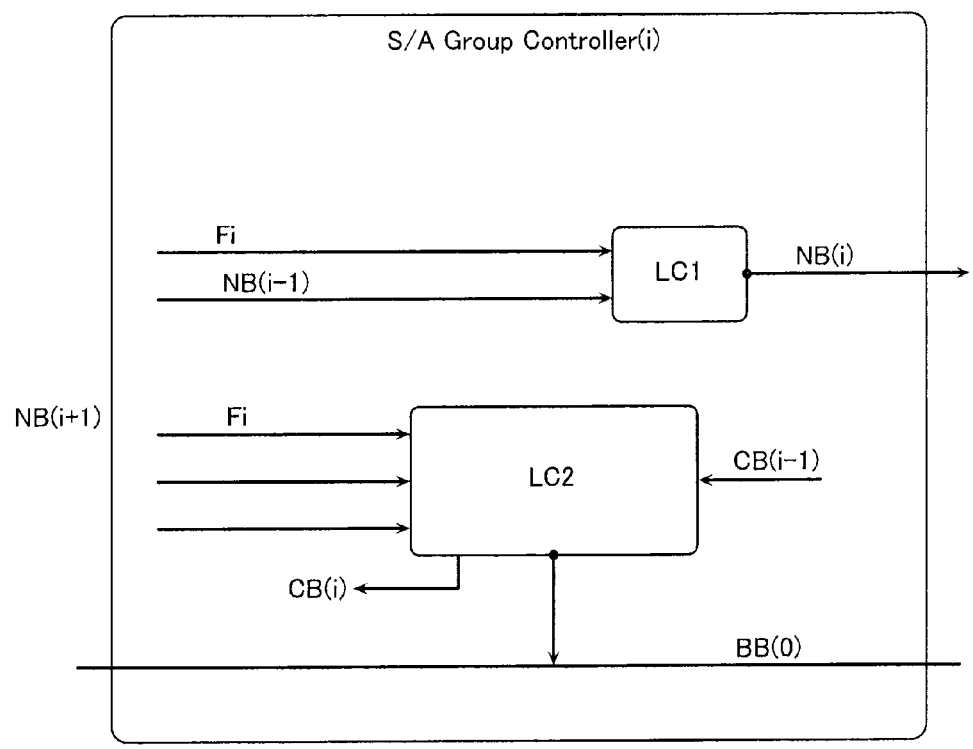
FIG. 11 is a block diagram showing an example of configuration of a sense amplifier group control circuit 5(i) in the second embodiment.

FIG. 11 is an example of configuration of the sense amplifier group control circuit 5(i) (i=0~2) in the second embodiment. This sense amplifier group control circuit 5(i) comprises two logical operation circuits LC1 and LC2. The logical operation circuit LC1 outputs logical AND of the defect address flag F(i) and the next baton signal NB(i+1) as the next baton signal NB(i). In addition, the logical operation circuit LC2 performs a logical operation of the defect address flag F(i) and the next baton signal NB(i+1) to output the bypass baton signal BB(0), and outputs the control baton signal CB according to the control baton signal CB(i−1) and the defect address flag F(i). The sense amplifier group control circuits 5(4)~5(6) also have an identical configuration, hence description thereof is omitted. Moreover, the sense amplifier group control circuits 5(3) and 5(7), although differing in that a terminal corresponding to the next baton signal NB is fixed at "H", are also identical regarding other configurations.

Figure 12A:
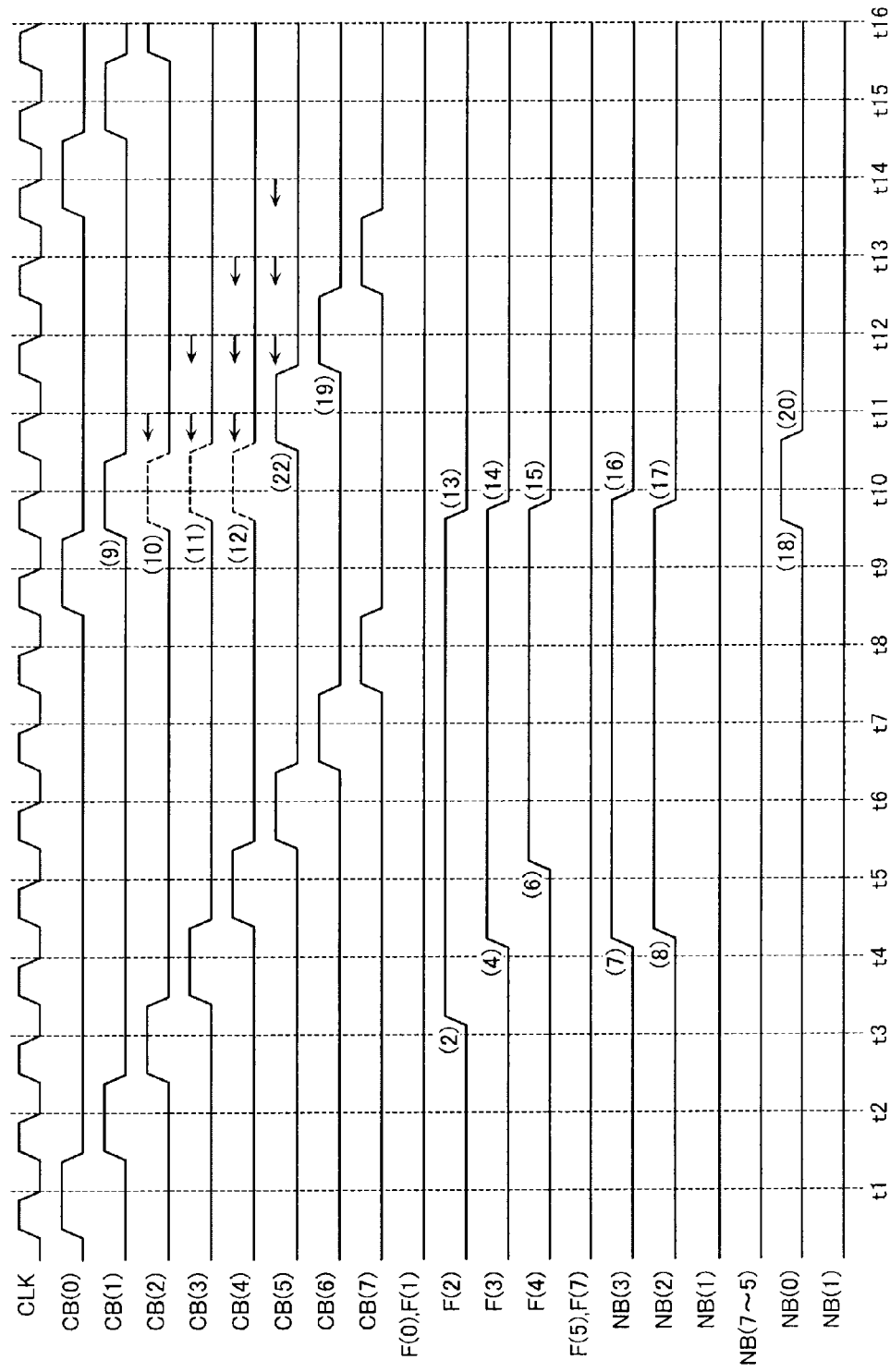
FIG. 12A is a timing chart explaining a specific example of operation of the semiconductor memory device in the second embodiment.
Figure 12B:
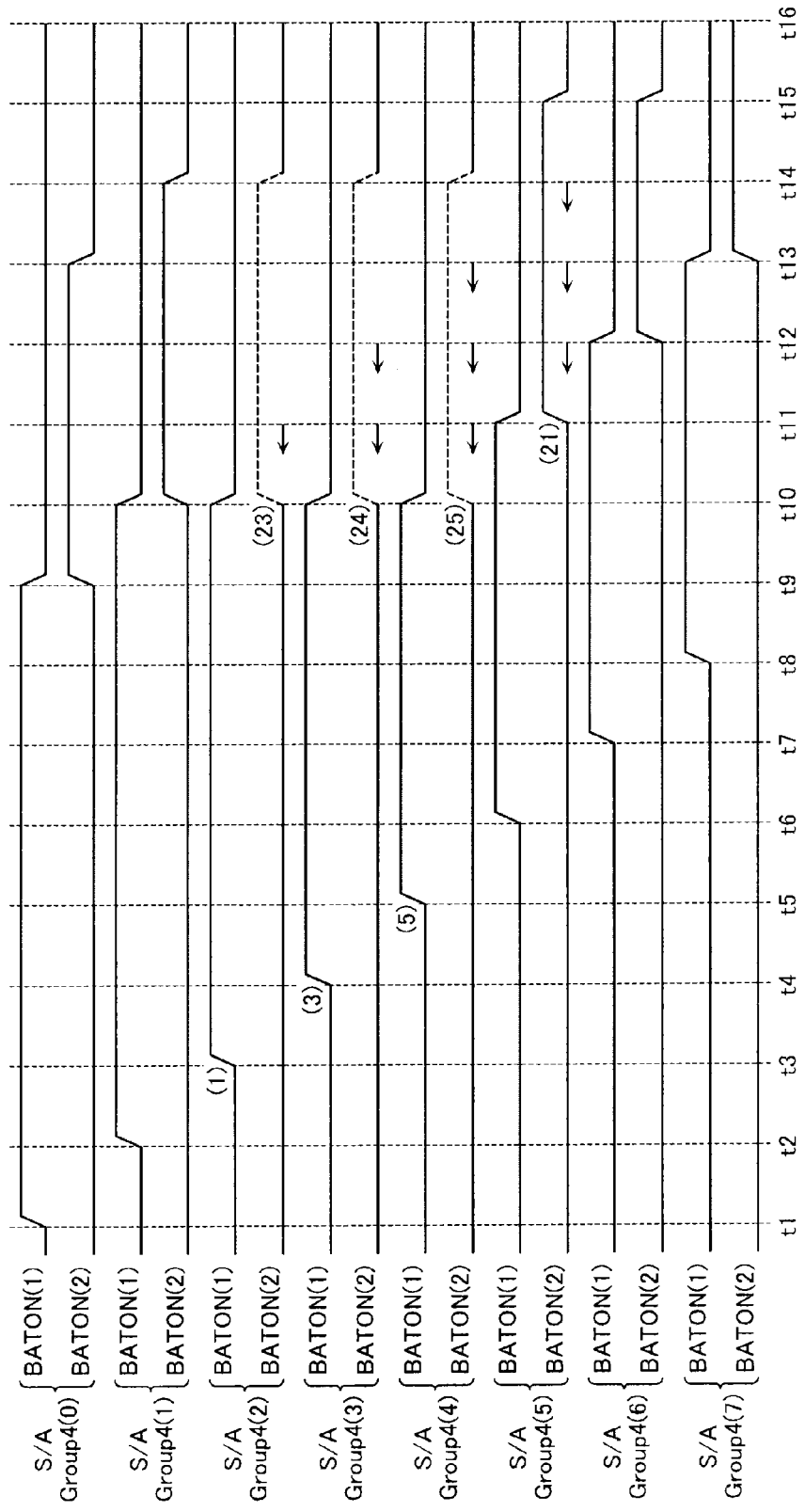
FIG. 12B is a timing chart explaining a specific example of operation of the semiconductor memory device in the second embodiment.

FIGS. 12A and 12B are timing charts showing an example of operation in this second embodiment. This example describes the case where, for example, columns corresponding to the sense unit UNIT(2) in the sense amplifier groups 4(2)~4(5) are defective columns.

When the baton signal BATON(1) of the sense amplifier group 4(2) becomes "H" at time t3 ((1) in FIG. 12B), the defect address flag F(2) switches to "H" ((2)). Then, when the baton signal BATON(1) of the sense amplifier group 4(3) becomes "H" at time t4((3)), the defect address flag F(3) becomes "H" ((4)), and when the baton signal BATON(1) of the sense amplifier group 4(4) becomes "H" at time t5((5)), the defect address flag F(4) switches to "H" ((6)).

As a result of the defect address flags F(3) and F(2) becoming "H" in this manner, the next baton signals NB(3) and NB(2) rise to "H", sequentially ((7) and (8)). Therefore, when the control baton signal CB(1) becomes "H" again at time t9, the defect address flags F(2) and F(3) are "H", hence the control baton signals CB(2)~CB(3) also rise to "H", substantially simultaneously to this rise to "H" of the control baton signal CB(1) and non-synchronously with the clock signal CLK ((10) and (11)).

Moreover, because the next baton signals NB(2) and NB(3) are both "H" and the defect address flags F(3) and F(2) are also "H", the bypass baton signal BB(0) also rises to "H" in a vicinity of time t9. This bypass baton signal BB(0) is inputted to the sense amplifier group control circuit 5(4), but because the defect address flag F(4) is "H", the control baton signal CB(4) also rises to "H", substantially simultaneously to the control baton signals CB(1)~CB(3) and non-synchronously with the clock signal CLK. Then, when the control baton signal CB(4) switches to "L", the control baton signal CB(5) rises to "H" ((22)).

In this way, the control baton signals CB(1)~CB(4) become "H" substantially simultaneously, whereby the baton signal BATON(2) in the sense amplifier group 4(2) becomes "H" earlier by an amount of the cycle T compared to when there was no column defect ((23)). The baton signal BATON(2) in the sense amplifier group 4(3) becomes "H" earlier by an amount of a cycle of 2T compared to when there was no column defect ((24)). The baton signal BATON(2) in the sense amplifier group 4(4) becomes "H" earlier by an amount of a cycle of 3T compared to when there was no column defect ((25)). The sense units UNIT(2) in the sense amplifier groups 4(2) ~4(4) are defect columns, hence are not provided with data.

When the control baton signal CB(2) becomes "1", the defect address flag F(2) returns to "L" ((13)), whereby the next baton signal NB(2) also returns to "L" ((17)). Similarly, when the control baton signal CB(3) becomes "1", the defect address flag F(3) returns to "L" ((14)), whereby the next baton signal NB(3) also returns to "L" ((16)). Similarly, when the control baton signal CB(4) becomes "1", the defect address flag F(4) returns to "L" ((15)). When the defect address flags F(2) ~F(4) all return to "L", the bypass baton signal BB(0) attains a floating state, whereby a "1" state is maintained. When the control baton signal CB(4) becomes "L" synchronously with the next clock signal CLK, the bypass baton signal BB(0) returns to "L" ((20)).

As mentioned above, the baton signal BATON(2) in the sense amplifier group 4(2), the baton signal BATON(2) in the sense amplifier group 4(3), and the baton signal BATON(2) in the sense amplifier group 4(4) become "H" with a timing which is earlier than a normal timing, due to presence of defective columns.

Next, the baton signal BATON(2) in the sense amplifier group 4(5) becomes "H", but this timing is a timing at which data is inputted to the sense unit UNIT(2) of the sense amplifier group 4(2) if there is no defective column. That is, when the sense unit UNIT(2) of the sense amplifier group 4(2) is defective, data which ought to have been written to the sense unit UNIT(2) of the sense amplifier group 4(2) can be written to the sense amplifier group 4(5) without any time delay occurring.

Advantages of Second Embodiment

As described above, the semiconductor memory device in the second embodiment can display similar advantages to those of the first embodiment. In addition, this embodiment enables propagation delay of the control baton signal to be suppressed and rescue efficiency maintained, even if the number of sense amplifier group control circuits increases.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
    a memory cell array configured having a plurality of bit lines and a plurality of memory cells arranged therein;
    a sense amplifier circuit operative to detect and amplify a signal read from the memory cell into the bit line; and
    a sense amplifier control circuit operative to control the sense amplifier circuit,
    the sense amplifier circuit being divided into a plurality of sense amplifier groups,
    the plurality of sense amplifier groups each being further divided into a plurality of sense units,
    the sense amplifier control circuit being configured to sequentially select the plurality of sense amplifier groups according to a physical address allocated to a column, and to sequentially select the plurality of sense units included in a selected sense amplifier group, and
    the sense amplifier control circuit being configured to, when there is a defect related to a selected sense unit in a selected first sense amplifier group, select, in place of the first sense amplifier group, a sense unit included in a second sense amplifier group selected following after the first sense amplifier group.

2. The semiconductor memory device according to claim 1, wherein
    the number of sense amplifier groups is A, and
    reference numbers of the physical addresses provided to the plurality of sense units in one sense amplifier group each differ by A.

3. The semiconductor memory device according to claim 1, wherein
    at least one of the plurality of sense units in one sense amplifier group is a column redundancy-dedicated sense unit.

4. The semiconductor memory device according to claim 1, wherein
    the sense amplifier control circuit is divided into a plurality of sense amplifier group control circuits, the plurality of sense amplifier group control circuits each corresponds to a respective one of the sense amplifier groups, and
    the plurality of sense amplifier group control circuits configure a loop circuit and are configured to be sequentially activated by transferring of logic of a control baton signal in the loop circuit.

5. The semiconductor memory device according to claim 4, wherein
    the plurality of sense units configure a loop circuit and are configured to be sequentially activated by transferring of a baton signal in the loop circuit.

6. The semiconductor memory device according to claim 4, further comprising:
    a defect address flag holding circuit operative to hold a defect address flag indicating a defect,
    wherein the sense amplifier group control circuit is configured to change timing of a change in logic of the control baton signal based on a state of the defect address flag.

7. The semiconductor memory device according to claim 6, wherein
    the plurality of sense units configure a loop circuit and are configured to be sequentially activated by transferring of a baton signal in the loop circuit.

8. The semiconductor memory device according to claim 7, wherein
    the baton signal is a signal having logic thereof changed according to the control baton signal.

9. The semiconductor memory device according to claim 6, wherein
    a plurality of the control baton signals outputted by the plurality of sense amplifier group control circuits each change in a second cycle which is larger than a first cycle, and have phases differing by the first cycle.

10. The semiconductor memory device according to claim 1, wherein
    the plurality of sense units each comprise a defect address flag holding circuit operative to hold a defect address flag indicating a defect.

11. The semiconductor memory device according to claim 9, wherein
    the second cycle has a value which is the first cycle multiplied by the number of sense amplifier groups.

12. A semiconductor memory device, comprising:
a memory cell array configured having a plurality of bit lines and a plurality of memory cells arranged therein;
a sense amplifier circuit operative to detect and amplify a signal read from the memory cell into the bit line; and
a sense amplifier control circuit operative to control the sense amplifier circuit,
the sense amplifier circuit being divided into a plurality of sense amplifier groups,
the plurality of sense amplifier groups each being further divided into a plurality of sense units,
the sense amplifier control circuit being divided into a plurality of sense amplifier group control circuits, and the plurality of sense amplifier group control circuits each corresponding to a respective one of the sense amplifier groups,
the plurality of sense amplifier group control circuits configuring a loop circuit and being configured to be sequentially activated by transferring of logic of a control baton signal in the loop circuit,
the plurality of sense units configuring a loop circuit and being configured to be sequentially activated by transferring of a baton signal in the loop circuit, and
the sense amplifier group control circuit, when there is a defect related to the sense unit in the corresponding sense amplifier group, changing timing of switching the control baton signal.

13. The semiconductor memory device according to claim 12, wherein
the plurality of sense units each comprise a defect address flag holding circuit operative to hold a defect address flag indicating there is a defect in a corresponding column.

14. The semiconductor memory device according to claim 13, wherein
the sense amplifier group control circuit is configured to transfer a next baton signal in a reverse direction to a direction that the control baton signal is transferred in the loop circuit, and is configured to output a bypass baton signal for shorting the loop circuit according to a state of the next baton signal and the defect address flag.

* * * * *